United States Patent [19]

Yamazaki et al.

[11] Patent Number: 5,196,366
[45] Date of Patent: Mar. 23, 1993

[54] METHOD OF MANUFACTURING ELECTRIC DEVICES

[75] Inventors: Shunpei Yamazaki, Tokyo; Kenji Itoh, Zama; Masaya Kadono, Atsugi; Naoki Hirose, Shimonoseki, all of Japan

[73] Assignee: Semiconductor Energy Laboratory Co., Ltd., Kanagawa, Japan

[21] Appl. No.: 567,352

[22] Filed: Aug. 15, 1990

[30] Foreign Application Priority Data

Aug. 17, 1989 [JP] Japan ............................ 1-211801

[51] Int. Cl.⁵ ................................. H01L 21/302
[52] U.S. Cl. ................................. 437/61; 437/67;
  437/63; 437/61; 437/975; 437/228; 437/127; 357/17
[58] Field of Search ............... 357/17, 30; 437/67, 437/61, 62, 69, 127, 975, 228, 63

[56] References Cited

U.S. PATENT DOCUMENTS 4,557,794 12/1985 McGinn et al.
4,570,330 2/1986 Cogan ............................ 437/62
4,672,023 6/1987 Leung.
5,036,373 7/1991 Yamazaki ....................... 357/60

FOREIGN PATENT DOCUMENTS 0276960 3/1988 European Pat. Off.

OTHER PUBLICATIONS

Applied Physics Letters, vol. 53, No. 19, Nov. 7, 1988, pp. 1815–1817, American Institute of Physics, N.Y., U.S.; K. Hirabayashi et al.: "Selective deposition of diamond crystals by chemical vapor deposition using a tungsten-filament method".

Japanese Journal of Applied Physics, vol. 26, No. 6, Jun. 1987, pp. L1032–L1034, Tokyo, JP; H. Kawarada et al.: "Large area vapour deposition of diamond particles and films using magneto-microwave plasma".

IBM Technical Disclosure Bulletin, vol. 24, No. 7B, Dec. 1981, pp. 3689–3690, New York, U.S.; V. J. Silvestri: "Silicon-silicon dioxide-silicon structures".

Soviet Physics Semiconductors, vol. 19, No. 8, Aug. 1985, pp. 829–841, New York, U.S.; V. K. Bazhendov et al.: "Synthetic diamonds in electronics (review)".

Primary Examiner—Brian E. Hearn
Assistant Examiner—Trung Dang
Attorney, Agent, or Firm—Sixbey, Friedman, Leedom & Ferguson

[57] ABSTRACT

A method of manufacturing electric devices is described. Discrete single crystals are formed on a substrate to be coated. The formation of these crystals is carried out by forming discrete crystallization centers in the surface of the substrate and growing a single crystal from each center. The spaces separating these crystals are filled with an insulating material in order not to form short current paths therein. The top surfaces of the crystals are exposed in order to make contact with an upper electrode.

12 Claims, 4 Drawing Sheets

METHOD OF MANUFACTURING ELECTRIC DEVICES

BACKGROUND OF THE INVENTION

1. Field of the Invention

The present invention relates to a method of manufacturing electric devices and, more particularly to a method of manufacturing electric device utilizing crystalline films such as diamond light emitting devices.

2. Description of the Prior Art

There have been many electric devices utilizing thin film semiconductors. The manufacturing methods of such devices require suitable measures to overcome peculiar problems originating from film semiconductors.

For emission of reddish light rays, GaAs semiconductors have been utilized to manufacture light emitting devices for more than a decade. The emission of blue or green light, as well as white light, however, has long been hardly realized by means of solid state devices.

The inventor has before proposed to make a light emitting device from a diamond film which can emit light at short wave lengths, for example, as described in Japanese Patent Application No sho 56-146930 filed on Sep. 17, 1981. Diamond is promising, as a light emitting substance for mass production, because of its high thermal resistance, chemically stabilities and low price, in view of a great demand for light emitting devices in the market. It is, however, very difficult to manufacture diamond light emitting devices at a high yield required for commercialization because there are formed a large proportion of products whose efficiencies are undesirably too low to satisfy the requirement of the application thereof. Furthermore, the performance of prior art diamond devices tend to quickly age by actual operation. For example, prior art diamond light emitting devices were heated up to 50° C. only by application of 30 V for 10 min. and the performances were then significantly degraded.

The light emitting action of diamond light emitting devices takes place when a relatively large current is passed through diamond crystals by applying a voltage between a pair of electrodes sandwiching the diamond crystals. The electric energy carried by the current, however, is consumed largely only to produce heat rather than to emit light rays. The inventor successed in the discovery of the origin of the low efficiencies and the heat generation. As a result, the following fact has been found.

When deposited, diamond tends to form a polycrystalline film 2 composed of columnar crystals 2 grown at right angles on a substrate as illustrated in FIG. 1. There are formed many grain boundaries 4 extending through the diamond film 2. It was found by Raman spectroscopic analysis that these grain boundaries consists of segregation of carbon graphite (having $sp^2$ bonds) which has a resistivity substantially lower than that of diamond crystals (having $sp^3$ bonds), e.g. by a factor of $10^2 \sim 10^4$. Furthermore, these boundaries tend to gather impurities such as metallic ions occurring inadvertently in the film 2 or introduced intentionally into diamond films particularly during thermal treatment. The metallic ions or other impurities also function to elevate the conductivity of the boundaries. Because of this, a large proportion of current flows across the film along the boundaries rather than through the diamond crystals. It is for this reason that prior art diamond electric devices can not exhibit sufficient performances which are inherently expected from the characteristics of diamond itself. For example, the current passing through the boundaries has no contribution to light emitting but only function to generate heat. Another origin of heat generation is existence of pinholes 5 passing through the film 2 which are undesirably but often formed during deposition. When an upper electrode 3 is deposited, short current passages are formed undesirably. Similar drawbacks commonly exist in other crystalline films.

BRIEF SUMMARY OF THE INVENTION

It is an object of the present invention to provide a method of manufacturing electric devices with a crystalline film having high reliability and performance.

It is another object of the present invention to provide a method of manufacturing electric devices at a high yield in mass production.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

To achieve the foregoing and other object, and in accordance with the present invention, as embodied and broadly described herein, a number of crystallization centers are formed on the surface of a substrate to be coated with a crystalline film. The centers are so minute as to allow epitaxial growth of one single crystal form each other and so separated as not to provoke substantial interference between adjacent crystals. The spaces or clearance between these crystals is filled with an insulating material in order not to form short current paths therethrough. The substrate may be a semiconductor or single crystalline diamond substrate.

The insulating material may be either organic or inorganic as long as the resistivity is sufficiently high. For example, organic resins, silicon oxide or phosphosilicate glass, or other insulating glasses may be used. An electrode arrangement is formed over the insulating material in order to make contact with the top surface of the crystals. When columnar single crystals of diamond are formed with the (100) plane or the (110) plane as their upper surfaces, the electrode arrangement proximately contacts the upper surface directly or through a buffer layer while other side surfaces are insulated by the insulating material.

By this structure, the electrode arrangement makes electrical contact only with diamond crystals at their top surfaces and therefore current passes through the insides of the crystals. The current induces recombination of electron-hole pairs between mid-gap states (radiation centers), between the mid-gap states and a valence band, between a conduction band and the mid-gap states and between the conduction band and the valence band. The spectrum of light emitted from a diamond film is determined by differential energy levels between the mid-gap states, the bottom of the conduction band and the apex of the valence band. Depending upon the differential levels, it is possible to emit blue or green light or radiation having continuous spectrum of wavelengths over a relatively wide range such as white light.

The above discussion can be applied for general natures of crystalline films consisting of columnar crystals, and therefore the present invention has general applicability to other crystalline material than diamond.

BRIEF DESCRIPTION OF THE DRAWINGS

The accompanying drawings, which are incorporated in and form a part of the invention and, together with the description, sever to explain the principles of the invention.

DETAILED DESCRIPTION OF THE PREFERRED EMBODIMENTS

Figure 1:
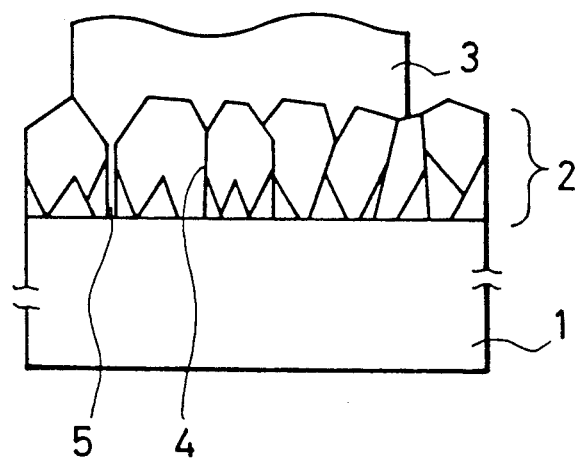
FIG. 1 is a cross sectional view showing a prior art diamond light emitting device.
Figure 2A:
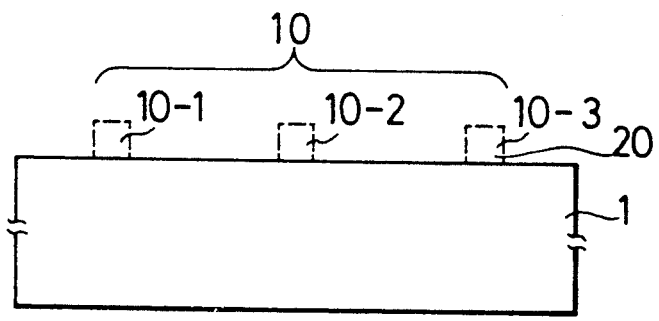
FIGS. 2(A) to 2(D) are cross sectional views showing a method of manufacturing diamond light emitting devices in accordance with a first embodiment of the present invention.
Figure 2B:
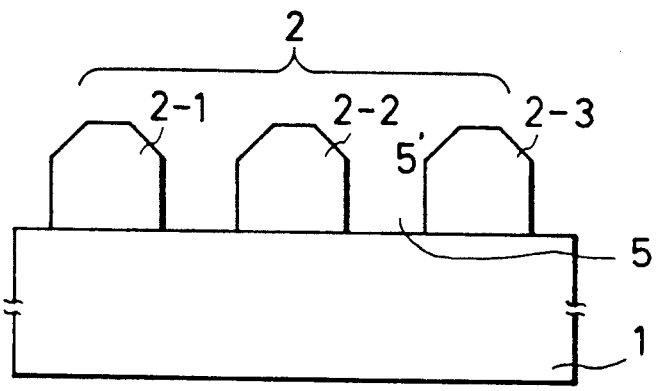
Figure 2C:
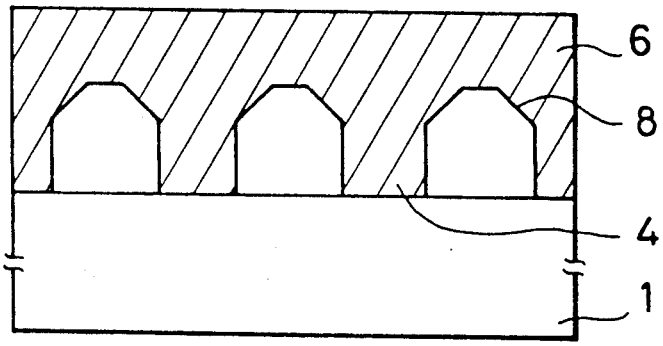
Figure 2D:
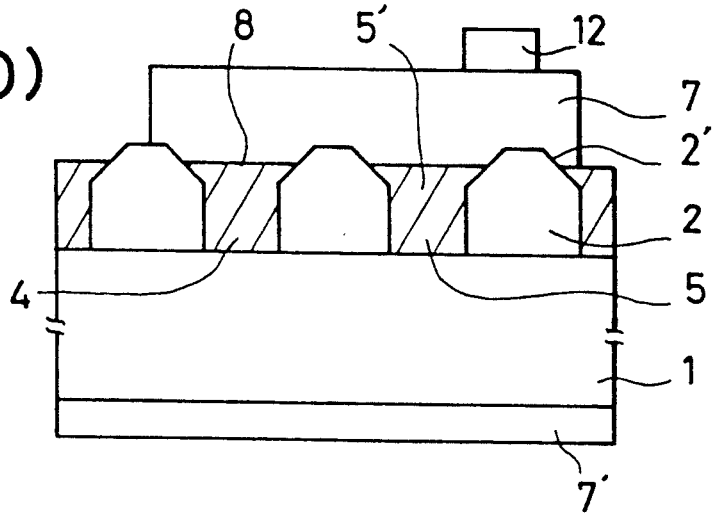

Referring now to FIGS. 2(A) to 2(C), a method of forming a light emitting device in accordance with a first embodiment of the invention will be explained. A silicon semiconductor substrate 1 has been heavily doped with boron ions or phosphorus ions in order to be a p-type or n-type impurity semiconductor substrate having a low resistivity. The surface of the substrate to be coated is finely scratched by putting it in an alcohol in which diamond fine particles are dispersed and applying ultrasonic waves thereto for 10 min. to 1 hour. The scratches form focuses on the surface of the substrate for growing diamond crystals therefrom. A silicon oxide film is coated over the scratched surface and patterned by photoetching to leave a mask 10 consisting of a number of discrete segments 10-1, 10-2 and 10-3 which are 0.2 to 2.0 micrometers square, e.g. 1 micrometer square. These segments are separated by 10 to 50 micrometers distances from each other in order not to provoke interference therebetween. The scratched surface coated with the mask 10 is subjected to argon ion bombardment in order to make the surface to be amorphous except for surface portions protected by the mask 10. Then, a number of crystallization centers are formed, by removing the mask 10, within an amorphous surface from which crystal growth hardly occurs. Next, diamond single crystals are grown from the crystallization centers formed on the surface by a known microwave-assisted plasma CVD method in a magnetic field. The CVD methods of such a type include ECR CVD or MCR CVD as described in Japanese Patent Application No. sho 61-292859 filed on Dec. 8, 1986 and U.S. patent application Ser. No. 07/178,362 of the applicant.

The microwave CVD process of the diamond crystals is carried out in a plasma CVD chamber provided with a microwave oscillator capable of emitting microwaves at 2.45 GHz at a maximum output power of 10 KW and a pair of Helmholts coils. The coils are energized to a maximum input power of 2 KW during the deposition to induce a magnetic field having a resonating strength of 875 Gauss at the surface of the substrate to be coated. The deposition of carbon (growth of diamond) will be carried out in accordance with the following procedure.

The substrate having crystallization centers in disposed in the chamber in order to experience the magnetic field of 755 Gauss. After evacuating the inside of the chamber to $10^{-3}$ to $10^{-6}$ Torr, a reactive gas is introduced to a pressure of 0.01 to 5 Torr, e.g. 0.26 torr. The reactive gas comprises an alcohol such as methyl alcohol ($CH_3OH$) or ethyl alcohol ($C_2H_5OH$) diluted with hydrogen at a volume ratio of alcohol/hydrogen=0.2 to 2. In case of methyl alcohol, the ratio is selected for example 0.5. In case of ethyl alcohol, the ratio is selected for example 0.25. Instead of these alcohols, carbon compounds comprising hydrogen and fluorine such as $CH_3F$, $CH_2F_2$, $CHF_3$, $C_2H_5F$, $C_2H_4F_2$ or $C_2H_3F_3$ diluted by hydrogen can be employed. Then, microwaves are applied at 2.45 GHz in the direction parallel to the direction of the magnetic field to cause ionized particles of the reactive gas in the form of plasma to resonate therewith in the magnetic field. The input power of the microwaves is 5 KW. As a result, a number of columnar crystals 21-1, 21-2 and 21-3 of diamond epitaxially grow from the crystallization centers formed on the substrate. During the crystal growth, there occurs no interference between adjacent diamond crystals by virtue of the sufficient distance therebetween. The deposition is substantially single crystalline epitaxial growth and therefore there is formed no graphite. The columnar crystals are grown to a height of 0.5 to 10 micrometers, e.g. 1.3 micrometers when the CVD process is continued for 2 hours.

Next, a positive photoresist 6 is coated on the substrate over the diamond crystals 2 by a spin coating method. The photoresist is preferably chosen from transparent photoresists such as OFPR 800 having a viscosity of rank C which is diluted four times by a thinner to have an appropriate viscosity. The photoresist is then baked at 80° C. for 20 min. and exposed to ultraviolet light illumination from the upper side at 2 mW/cm² for about 6 seconds. The duration of this exposure to illumination is precisely adjusted in order to develop the photoresist only to a level designated by a broken line from the upper surface thereof (FIG. 2(C)). Namely, the photoresist is only developed to a plane which is perpendicular to the drawing sheet and slightly lower than the top surface of the diamond crystals, leaving the portion below the plane undeveloped filling the spaces between the diamond crystals. The developed portion of the photoresist is removed by a solution (NMD-3). The undeveloped portion is left as it is or by thermally cured (hardened) if necessary.

By this procedure, the formation of undesirable current paths is prevented except those from the top surface to the bottom surface of the diamond crystals. The upper surface of the structure is then coated with an upper electrode 7 made of indium tin oxide (ITO) or zinc oxide in direct electrical contact with the diamond crystals. On the electrode 7 is formed a lead electrode 12 which is made from a multilayered film consisting of aluminum, silver and/or molybdenum films. The lead electrode 12 may be formed by an aluminum film alone or a dual film consisting of a lower chromium or wolfram film and an upper aluminum film coated thereon. The lower chromium or wolfram film is high heat-resistant and has a high stability while the upper aluminum film is suitable for wire bonding.

Figure 3A:
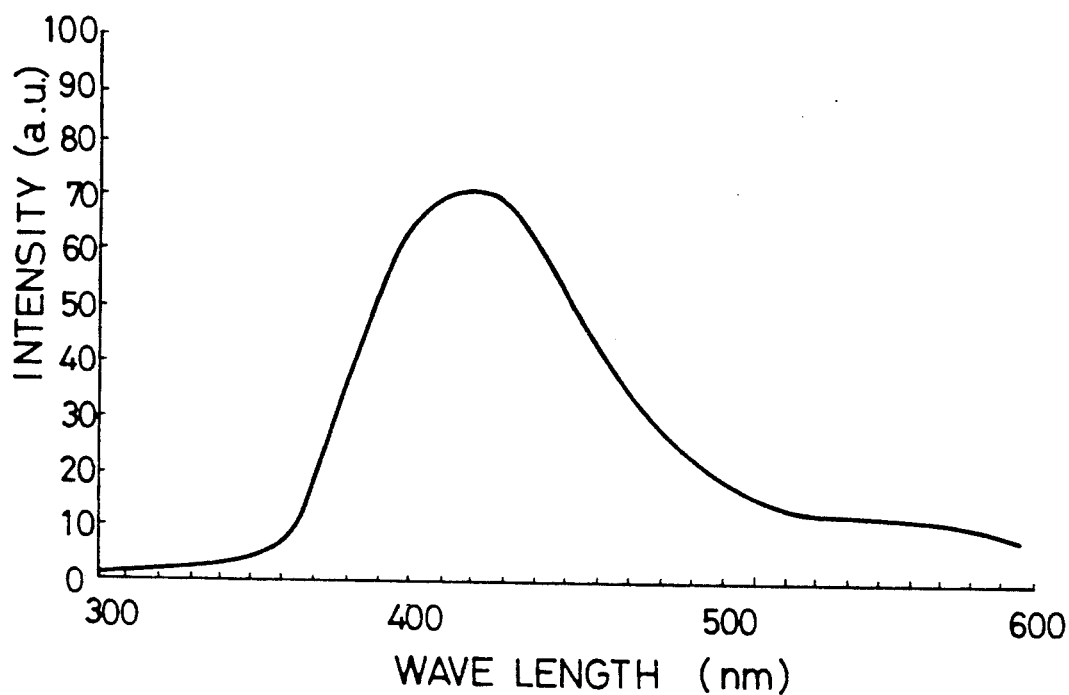
FIGS. 3(A) and 3(B) are diagrams showing spectra of illumination emitted from the diamond light emitting device in accordance with the first embodiment of the present invention.
Figure 3B:
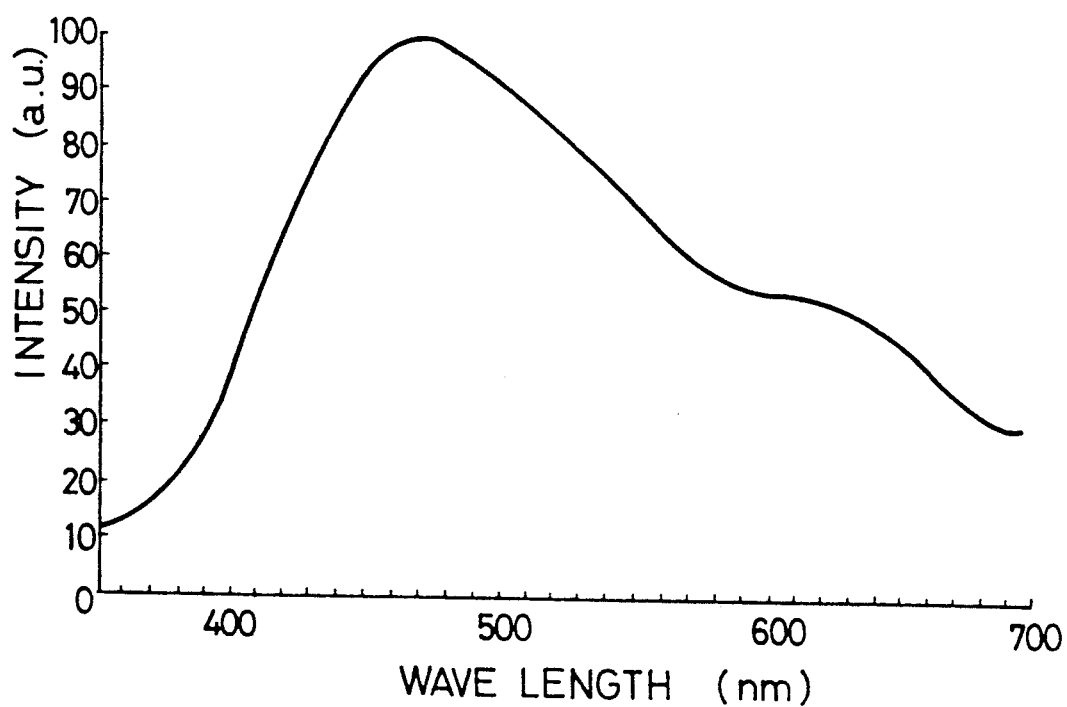

When a voltage of 5 to 100 V (e.g. 60 V) was applied across the diamond crystals of a diamond light emitting device formed in accordance with the above procedure by means of the upper electrode 7 and the substrate 1 functioning as the counterpart lower electrode, diamond crystals emitted green visual light by virtue of current passing therethrough. The voltage may be applied as a DC voltage or as a pulse train at 100 Hz of a duty ratio of 50%. The spectra of the illumination is as shown in FIG. 3(A). A peak of intensity appears at about 470 nm. The correspondence of the cathode luminescence is as shown in FIG. 3(B). The peak of this diagram is shifted toward the short wavelength region. The illumination was not appreciably reduced even when application of 60 V was continued for a month.

Figure 4A:
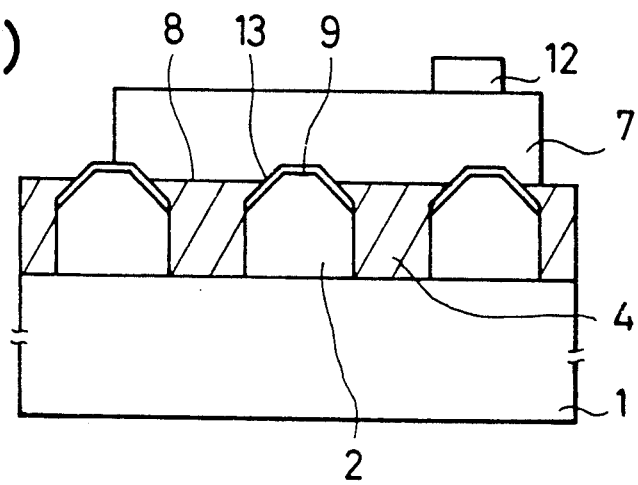
FIGS. 4(A) to 4(C) are cross sectional views showing second, third and fourth embodiments of the present invention.

Referring to FIG. 4(A), a light emitting device is illustrated in accordance with a second embodiment of the present invention. A number of diamond crystals 2 of 0.5 to 10 micrometers height, e.g. 2.5 micrometers height are formed on a silicon semiconductor substrate 1 with the aid of crystallization centers formed on the surface of the substrate in the same manner as the first embodiment. During the CVD process of the diamond crystal formation, however, diborane is introduced as a dopant gas in order to make the diamond crystals to be of a p-type. The top surfaces of the diamond crystals 2 are doped with oxygen and, if desired, phosphorus by ion implantation. The concentration of oxygen is for example $5 \times 10^{18}$ cm$^{-3}$. The concentration of phosphorus is for example $3 \times 10^{18}$ cm$^{-3}$. Sulfur or selenium may be used instead for the same purpose. Undesirable defects, which might be formed by the ion implantation, are cured by laser annealing with an excimer laser or thermal annealing in a vacuum. By these treatments, a number of recombination centers can be formed in the top surfaces of the diamond crystals. A filling of an insulating material 4 and an electrode arrangement 7 and 12 are provided in the same manner as the first embodiment.

When a 12 V was applied between the electrode 7 and the substrate of a light emitting device formed by this procedure, 6 cd/m$^2$ light emission was observed at 450 nm wavelength.

Figure 4B:
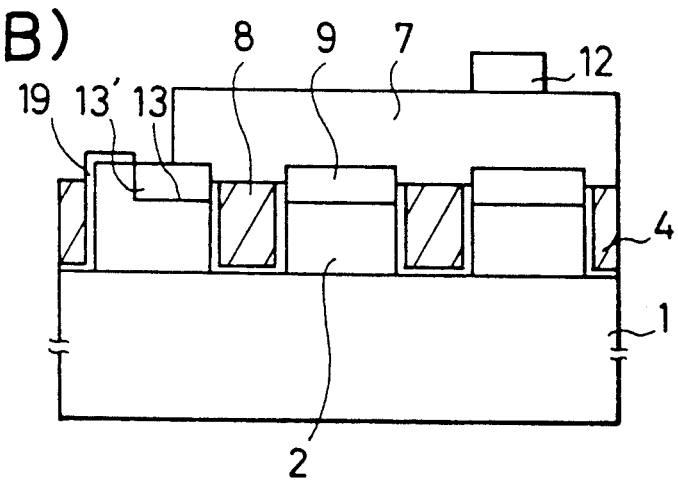

Referring now to FIG. 4(B), a third embodiment of the present invention will be explained. A number of diamond crystals are formed in the same manner as the previous embodiment with the (100) plane as their top surfaces. The reactive gas, however, comprises carbon monoxide (CO) and hydrogen. The substrate temperature should therefore be maintained at about 650° C. A silicon nitride film of 0.1 to 0.5 micrometer thickness is deposited on the substrate 1 conformly over the diamond crystals 2. Spaces between the crystals 2 are filled with an organic glass such as (CH$_3$)$_3$OH and (C$_2$H$_5$)$_4$O$_4$Si by a spin coating method. The organic component of the glass coating is driven off by heating at 200° to 500° C., e.g. 400° C. in order to leave an inorganic glass comprising mainly of silicon oxide. Excess inorganic glass beyond the crystals 2, if any, should be removed thereafter. The surfaces of the diamond crystals are doped with an impurity, e.g. phosphorus, oxygen, sulfur and/or selenium with a mask. The region of the crystals to be doped is selected in correspondence with an electrode, which is to be provided in a latter step. At the same time, the silicon nitride film 19 is correspondingly removed with the same mask. The structure is then laser annealed. The annealing can be carried out under pressure at a temperature of 700° to 1400° C. since the insulating material filling the spaces is composed mainly of silicon oxide and the external surfaces of the diamond crystals are protected by the silicon nitride film 19 so that it is avoided that the perimeters of the crystals come off from the insulating material. Light emitting devices formed by this procedure can be used for blue light or green light sources.

Figure 4C:
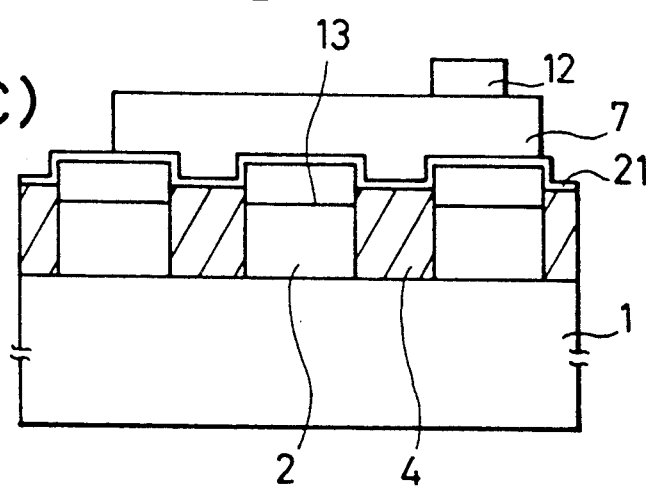

Referring now to FIG. 4(C), a fourth embodiment of the present invention will be explained. A number of diamond crystals are formed on the substrate in the same manner as the previous embodiment. The surfaces of the diamond crystals are doped with an impurity, e.g. phosphorus, oxygen, sulfur and/or selenium. After filling the spaces between the crystals with an insulating material, a film made of a rare earth metal oxide such as hafnium oxide film is deposited to 0.1 to 0.5 micrometer by sputtering as a buffer layer. An electrode 7 is provided in order to make contact with the doped diamond crystals 2 only through the buffer layer 21. Light emitting devices formed by this procedure can be used for blue light sources.

Similar electric devices can be formed by use of crystal-line boron nitride films instead of diamond film in accordance with any above embodiments in the same manner. The method and structure are substantially same as described above except particularly provided in this paragraph. In this case, suitable substrates to be coated with crystalline boron nitride are made from, for example, beryllium nitride, diamond, a silicon semiconductor. The suitable reactive gases are, for example; boron source gases such as diborane (B$_2$H$_6$), boron fluoride (BF$_3$), organic boron compounds, methylboron (B(CH$_3$)$_3$) and nitrogen source gas such as ammonia (NH$_3$), nitrogen (N$_2$), nitrogen fluoride (NF$_3$). The boron source gases and the nitrogen source gases are used in combination. Some gaseous compounds such as borofluoric ammonium (NH$_4$BF$_4$) have both functions of the boron and nitrogen source and can be used alone without associated another reactive gas. The pressure of reactive gases during deposition is 0.01 to 10 Torr, typically 0.1 to 1 Torr, e.g. 0.26 torr. The input power of microwaves is 2 to 10 KW. The height of the boron nitride columnar crystals is 0.5 to 5 micrometers, e.g. 1.3 micrometers on the average. The substrate temperature is 400° to 1200° C., e.g. 1000° C. Other conditions are same as used in the above embodiments.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Although the photoresist is positive in the first embodiments, a negative photoresist can be used when the electric device is constructed on a transparent substrate. In this case, the negative photoresist is cured by illumination effected from the substrate side.

The present invention is broadly applicable to any electric device which utilizes a crystalline film-like structure since the principle is based only upon the general feature of deposited crystals in the form of a layer. These electric devices can be formed on a single substrate, i.e. an integrated circuit device which may consists of diamond light emitting devices, diamond diodes, diamond transistors, diamond resistances, diamond capacitors and the like. Of course, it is possible to severe a single substrate, after a number of diamond devices are formed on the substrate, into individual separate devices.

What is claimed is:

1. A method of manufacturing an electric device comprising the steps of:
   forming a number of discrete crystallization centers on a surface;
   growing one single crystal of diamond or boron nitride from each crystallization center; and
   filling spaces between the single crystals grown from said crystallization centers on said surface with an insulating material.

2. A method of manufacturing an electric device comprising the steps of:
   forming a number of discrete crystallization centers on a semiconductor substrate;
   growing one single crystal of diamond and boron nitride from each crystallization center to create a plurality of spaced apart crystals on said substrate, and
   filling the spaces between the single crystals grown from said crystallization centers while leaving the tops of the crystals exposed to avoid the creation of short circuits between crystals when an electric voltage is applied between the tops of the crystals and the substrate.

3. The method of claim 1 wherein said surface is one surface of a semiconductor substrate.

4. The method of claim 3 wherein said crystallization centers are formed on said surface by partially giving scratches to discrete areas of said surface.

5. The method of claim 4 wherein the portion of said surface that has not been given scratches is made amorphous.

6. The method of claim 5 wherein said amorphous surface is formed by ion bombardment upon the surface.

7. The method of claim 1 wherein said growing step is carried out by CVD assisted by microwaves.

8. The method of claim 7 wherein said CVD is carried out in a magnetic field.

9. The method of claim 1 wherein said filling step of said insulating material is carried out by coating a photoresist on said surface over said crystals, partially developing said photoresist by illumination and removing the portion of said photoresist covering the top surfaces of said crystals.

10. The method of claim 1 wherein top surfaces of said single crystals are exposed.

11. A method of manufacturing an electric device comprising the steps of:
    forming a number of discrete crystallization centers on a semiconductor substrate;
    growing one single crystal of diamond or boron nitride from each crystallization center;
    filling spaces between the single crystals grown from said crystallization centers with an insulating material; and
    forming a conductive layer on said single crystals.

12. The method of claim 11 further comprising the step of forming an electrode arrangement on said insulating material and said single crystals in order that said electrode arrangement makes electric contact with said single crystals only at said top surfaces.

* * * * *